United States Patent [19]

Kohm

[11] Patent Number: 4,774,279

[45] Date of Patent: Sep. 27, 1988

[54] ADHERENT COATING FOR COPPER

[75] Inventor: Thomas S. Kohm, Huntington, N.Y.

[73] Assignee: Kollmorgen Corporation, Simsbury, Conn.

[21] Appl. No.: 282

[22] Filed: Jan. 14, 1987

[51] Int. Cl.⁴ ............. C08L 61/04; C08L 29/04
[52] U.S. Cl. ............................. 524/509; 525/58
[58] Field of Search ............... 525/58, 491, 509

[56] References Cited

U.S. PATENT DOCUMENTS

| | | | |
|---|---|---|---|
| 2,917,416 | 12/1959 | Lavin et al. | 525/58 X |
| 3,322,881 | 5/1967 | Schneble, Jr. et al. | 174/68.5 |
| 3,350,498 | 10/1967 | Leeds | 174/68.5 |
| 3,442,834 | 5/1969 | Flowers et al. | 525/58 X |
| 4,211,603 | 7/1980 | Reed | 174/68.5 |
| 4,254,007 | 3/1981 | Flowers et al. | 525/58 X |
| 4,486,466 | 12/1984 | Leech et al. | 427/96 |
| 4,522,850 | 6/1985 | Leech | 427/304 |

*Primary Examiner*—Theodore E. Pertilla
*Attorney, Agent, or Firm*—Morgan & Finnegan

[57] ABSTRACT

A primer coating composition suitable for coating the inner layers of multilayer boards is disclosed. The cured coating is capable of maintaining adhesion without outgassing for at least 10 seconds at 250° C. It can be adhesion promoted for adherent electroless metal deposition with a chromic acid adhesion promotion solution. The coating composition comprises the product of reacting between 20 to 60% of a poly(vinyl acetal) resin with 80 to 40% of a phenolic resin in the presence of an acidic catalyst and a coupling agent having at least two amino substituted aromatic groups covalently bonded to a titanium or zirconium central atom via an oxygen containing linkage.

11 Claims, No Drawings

ADHERENT COATING FOR COPPER

FIELD OF THE INVENTION

This invention relates to primer coating compositions and methods of adherently bonding the primer coating compositions to metal and other surfaces. In particular, this invention relates to the field of printed wiring boards and multilayer boards and coatings used on surfaces of inner layer copper conductive patterns.

BACKGROUND OF THE INVENTION

It is difficult to permanently bond copper surfaces and insulating organic substrates together. Copper has a tendency to form a weakly adherent oxide layer on its surface. Organic films may bond tenaciously to this oxide layer, but the layer in time separates from the copper surface causing failure of the bond.

In the printed wiring board industry, application of strongly adherent oxide layers on copper has been adopted to alleviate this problem. Such strongly adherent oxide layers are usually applied by immersing the copper surface in hot (40°–110° C.), strongly alkaline, hypochlorite solutions. This immersion produces an adherent, black, dendritic, oxide layer with a high surface area for adhering to organic films, coatings and laminated layers. In the printed wiring industry, this oxide layer is commonly called "black oxide".

Black oxide has not been completely problem free. If the immersion in the hot, alkaline, hypochlorite solution is too long or too hot, the oxide film may build too thick and the oxide dendrites become so long that they easily break off. This would lead to bond failure.

The black oxide layer is subject to attack by solutions which dissolve copper oxides. Such solutions include acids, and acidic cleaners, and solutions containing complexing and chelating agents for copper such as electroless and electroplating solutions. Use of such solutions are necessary in printed wiring board, and especially in multilayer board manufacturing. In multilayer board manufacturing, inner copper planes are coated with black oxide, and outer layers of insulator and copper are laminated over them. When holes are drilled through the multilayer laminate and the hole walls are plated to create electrical connections to the inner copper planes, the plating and cleaning solutions dissolve the black oxide surrounding the holes and leave a ring around the hole where there is no adhesion between the copper plane and the laminated insulating layer over it. This is known in the industry as "pink ring" since a pink ring of copper is visible in pattern of black oxide coated copper.

The black oxide layer is mainly copper (II) oxide. At elevated temperatures, copper (II) oxide is thermodyamically unstable and converts to copper (I) oxide destroying the bond between the organic layer and the copper surface. Also, at elevated temperatures, many organic compounds are oxidized by the copper oxide layer and, in turn, reduce the oxide to copper metal. These two effects combine to make the black oxide bond subject to failure under long term thermal aging conditions.

Many variations such as "thin oxide", "brown oxide" and "red oxide" have been offered to overcome the problems of black oxide. None has been universally successful. Black oxide has been completely replaced by a brass coating in the lamination of copper foil to printed wiring board base materials. The copper foil is coated on one side with a thin layer of electroplated brass or zinc and the coated layer bonded to the organic insulating base material. Some multilayer board manufacturers have used copper foil coated on both sides with brass to avoid using black oxide when bonding the outer layers to the copper surface of the inner layers. Unlike black oxide, the layer of brass cannot be applied after the inner layer conductor pattern has been etched, and the thin brass layer is easily damaged by handling, cleaning and printing and etching of the inner layer.

Poly(vinyl acetals), poly(vinyl formal) and poly(vinyl butyral), have been blended with phenolic resins for use as wire coatings and as adhesives for bonding metal to metal, for brake shoes and for honeycomb construction. Poly(vinyl butyral)-phenolic adhesives had been used for laminating copper foil to printed wiring board base materials. This use of poly(vinyl butyral)-phenolic adhesives was abandoned in the early 1960's because the adhesive bond to the copper foil was attacked by the gold plating solutions used to electroplate gold contact areas on the printed wiring boards.

SUMMARY

Objects of the Invention

It is an object of this invention to provide a coating for metal, e.g., copper surfaces which is strongly adherent both to the metal (copper) and to insulating surfaces during printed wiring board and multilayer board processing and subsequent thermal exposures.

It is also an object of this invention to provide poly(vinyl acetal)-phenolic layers with improved adhesion to metal (copper) at temperatures greater than 125° C.

It is an object of this invention to provide poly(vinyl acetal)-phenolic layers bonded to metal (copper) which do not separate or blister after repeated exposure to solder at 255° C.

It is also an object of this invention to provide a bonding layer for application to the inner layers of multilayer boards without the use of black oxide.

It is another object of this invention to provide phenolic-poly(vinyl acetal) coatings containing amine terminated coupling agents which are suitable as adhesion primers for the inner layers of multilayers. These primers form a thermally and chemically stable bond which will not blister or delaminate in subsequent processing or heat cycles.

DEFINITIONS

As used herein, the term phenolic resin means a polymer formed by the condensation reaction of an aldehyde and a phenol. The phenols include unsubstituted phenol and substituted phenols such as cresols, xylenols and resorcinol.

BRIEF DESCRIPTION OF THE INVENTION

This invention is directed a coating composition capable of adhering to a metal surface and maintaining the adhesion, essentially without outgassing, for at least 10 seconds when heated at 250° C. The cured coating is capable of being adhesion promoted by a chromic acid adhesion promotion solution. The coating composition comprises the product of reacting between 20 to 60% by weight of a poly(vinyl acetal) resin with 80% to 40% by weight of a phenolic resin in the presence of an acidic catalyst; a coupling agent having at least two amino substituted aromatic groups covalently bonded to a titanium or zirconium central atom via an oxygen containing linkage, said coupling agent being capable of coupling to a metal surface and reacting with the phenolic resin. The coupling agent is present in the composition in an amount sufficient to couple the poly(vinyl acetal)-phenolic resin reaction product to the metal surface. The coating composition includes sufficient organic solvent to dissolve the resins and coupling agent and establish a viscosity for the coating composition suitable for applying the coating composition to a substrate.

In another embodiment, this invention concerns a coating composition comprising the product of reacting between 20 to 60% by weight of a poly(vinyl acetal) resin with 80 to 40% by weight a phenolic resin in the presence of an acidic catalyst; a coupling agent having at least two amino substituted aromatic groups convalently bonded to a titanium or zirconium central atom via an oxygen containing linkage, the coupling agent being capable of coupling to a metal surface and bonding to the phenolic resin, the coupling agent being present in the composition in an amount sufficient to couple the poly(vinyl acetal)-phenolic resin reaction product to the metal surface; and an organic solvent.

In another aspect, the invention concerns a method of adherently bonding a primer coating composition to a surface at least a portion of the surface being a metal. The method comprises removing essentially all soil from the surface, and removing all oxides and oxide films from the surface of the metal to expose a substantially pure metallic surface, which then begins to reoxidize. The surface is dehydrated before the formation of a metallic oxide film greater than about 2.5 nm thick. Thereafter, the primer coating composition is applied to the surface before oxide film grows to greater than 2.5 nm. The primer coating composition includes the product of reacting between 20 to 60% by weight of a poly(vinyl acetal) resin with 80 to 40% by weight of a phenolic resin in the presence of an acidic catalyst, between 0.3 and 2% by weight of a coupling agent having at least two amino substituted aromatic groups covalently bonded to a titanium of zirconium central atom via an oxygen containing linkage and an organic solvent. The method includes curing the primer coating composition on the surface. The cured primer coating is capable of maintaining adhesion to the surface, essentially without outgassing, for at least 10 seconds when heated at 250° C.

In yet another embodiment, the invention concerns a method of adherently bonding a primer coating composition to a surface, at least a portion of which is copper or a copper alloy surface, by cleaning the surface and abrading it with an abrasive and water to expose a clean copper surface. Immediately after abrading it, the surface is rinsed to remove the abrasive, followed by expelling the rinsing solution from the surface and immediately dehydrating the surface by heating to at least 125° C. and less than 200° C. for about one minute. Thereafter the primer coating composition is applied to the surface in less than four hours after abrading the surface. The primer coating composition includes the product of reacting between 20 to 60% by weight of a poly(vinyl acetal) resin with 80 to 40% by weight of a phenolic resin in the presence of an acidic catalyst; between 0.3 and 2% by weight of a coupling agent having at least two amino substituted aromatic groups covalently bonded to a titanium or zirconium central atom via an oxygen containing linkage; and an organic solvent. The primer coating composition is cured on the surface. After cure, the primer coating is capable of maintaining the adhesion to the surface, essentially without outgassing, for at least 10 seconds when heated at 250° C.

DETAILED DESCRIPTION OF THE INVENTION

Poly(vinyl acetal)-phenolic resin coatings bonded to copper and having increased resistance to thermal degradation of the bond and high resistance to chemical attack of the interface between the copper surfaces and the coatings have been achieved by incorporating amine terminated coupling agents into the poly(vinyl acetal)-phenolic resin coating.

The preferred poly(vinyl acetals) are poly(vinyl butyrals), and the preferred phenolic resins are selected from the group of soluble resole resins. The percentage of the poly(vinyl acetal) in the poly(vinyl acetal)-phenolic resin can be from 20% by weight (poly(vinyl acetal) to 60% by weight poly(vinyl acetal).

The poly(vinyl acetal) resin and the phenolic resin are reacted together in solution in the presence of an acidic catalyst. The poly(vinyl acetal)-phenolic resin reaction is believed to be ester formation between the phenolic OH and the acetal.

The coupling agents are selected from the group of amine substituted organic zirconates and titanates. The preferred coupling agents are the amine substituted aromatic titanates and more preferred are the amine terminated aromatic zirconates. Most preferred are amine substituted aromatic titanates and zirconates having at least two amino substituted aromatic groups bonding via an oxygen containing linkage, e.g., via an oxygen atom.

The coupling agents are normally used to increase the wetting and bonding between the filler and the resin system. Most surprisingly, it has now been found that use of amine terminated coupling agents can increase the bonding between the resin system and metallic substrates such as copper. It has been found that not only does the aromatic amine couple to the metal substrate, but there is also a chemical reaction between the amine substituted coupling agent and the phenolic resin. This reaction is believed to form a chemical bond between the coupling agent and the resin which contributes to the high temperature and chemical resistance of the bond.

Fillers are added to the poly(vinyl acetal)-phenolic coating to provide reinforcement and toughness. The fillers used should provide heat resistance, toughness and should not lead to increased water absorption in the coating after cure. When the coating is applied to a metal surface, cured and a hole drilled through a coating, the proper filler will also improve the quality of the drilled hole wall by reducing or eliminating resin smear on the hole wall from the coating. The preferred amount of filler for reducing resin smear is at least 10 parts filler per 100 parts resin solids. If too much filler is added, it will cause torsion fracture of the interface between the coating composition, and a metal surface when the coating composition is applied and cured on the metal surface. This fracture can be seen on the walls of drilled holes. It is especially noticeable on the larger drilled holes. It is preferred to use less than 60 parts filler per hundred parts of the poly(vinyl acetal)-phenolic resin reaction product to avoid torsion fracture.

When the cured coating composition forms a portion of the hole wall of a through hole in a multilayer printed wiring board, the cured composition should be capable of adhesion promotion by a chromic acid adhesion promotion solution to give a microporous hydrophilic surface which will accept adherent metal deposits to make reliable plated through holes. Increasing the filler content of the composition from 0 to 60% increases the number and size of the micropores after adhesion promotion.

Fillers also are added to adjust the viscosity of the coating for application of the coating. If the coating viscosity is greater than 20 Pa.s, the filler aids in effecting the removal of air bubbles entrapped in the coating during application by the coating machines. To adjust the coating viscosity to greater than 20 Pa.s and effect the release of entrapped air bubbles during coating, it is preferred to use at least 20 parts filler per hundred parts resin more preferably 30 parts, and preferrably to use less than 60, more preferably less than 50, parts filler per hundred parts resin. The quantity of filler used to adjust viscosity and reinforce the coating will depend on the particle size and surface area per gram of filler. The preferred particle size is less than about 10 micrometers.

Preferred fillers are mineral fillers. Wollastonites, aluminas, talcs, silicates such as zirconium silicates, kaolin, attapulgites and other clays are among the fillers which may be used. Catalytic fillers, which make the coating catalytic for electrolessly plating metal thereon, may be included. The catalytic fillers are desirable when the coating will form part of the wall of a plated through hole for additive printed wiring boards.

Since coupling agents are used to increase wetting and bonding of fillers to resin system, the filler and coupling agent must be matched together.

With the proper filler selection, one coupling agent can serve for both purposes. When a filler is added, the quantity of coupling agent is adjusted to provide a bond between the resin system and the filler as well as the resin system and the metal surface. The optimum amount of coupling agent depends on the filler loading. Excess above the optimum can decrease the temperature resistance of the bond between the copper substrate and the primer. The optimum for any particular combination of phenolic and poly(vinyl acetal) resins and filler can be determined empirically. When no filler is used in the coating composition, the coupling agent is about 0.3%. At the higher filler loadings of this invention, the amount of coupling agent is up to 2% by weight of the total resin content of the coating composition.

The organic solvent can be selected from alcohols, ethers, ketones, esters, and aromatic solvents such as benzene, toluene, xylene and the like. The solvent should be capable of dissolving the resins and the coupling agents and aiding in wetting of the surface. The solvents should not entrap water in the coating and should evaporate completely from the coating during cure without forming blisters. Preferred solvents include butyl acetate, 2-ethoxyethanol, 2-butoxyethanol, 2-(2-butoxyethoxy)-ethanol and 2-ethoxyethanol acetate and mixtures thereof, including also diluents such as aliphatic naphthas. The lower boiling solvents are preferred for curtain coating application and the higher boiling solvents for serigraphic application. Sufficient solvent must be used to establish the proper viscosity for coating. In establishing the coating viscosity, the solvent must be balanced with the filler to achieve a viscosity and a rheology suitable for the coating method chosen.

In order for the coupling agent to contribute to the surprising heat and chemical resistance to the bond between the metal surface and the poly(vinyl acetal)-phenolic layer, the metal surface must be clean and substantially free of oxide when the poly(vinyl acetal)-phenolic coating is applied. For example, in the case of a copper surface, any of the common corrosion inhibitors, such as benzotriazoles and imidazoles, must be removed before application of the poly(vinyl acetal)-phenolic coating. For printed wiring board or multilayer board manufacturers, this may require changing cleaning solutions or brushes that have become contaminated with benzotriazoles or imidazoles.

The surface to be coated can be all or partly metallic. The non-metallic portion of the surface can be a polymeric material capable of withstanding high temperature such as an epoxy-glass laminate, polyimide, or other high temperature printed wiring base material. The surface should be cleaned to remove soil and to remove oxide or oxide films from the metallic portion of the surface. One method of cleaning and removing oxides is abrading with an abrasive such as an aqueous pumice slurry. A thin oxide, hydrous oxide or hydrated oxide film will form on the surface. As the oxide becomes thicker, it forms a weakly adherent layer which causes failure of the bond when stressed by heat or shock.

To prevent the film from growing too fast and too thick, i.e. greater than about 2.5 nm thick, the freshly abraded surface is immediately rinsed, dried and dehydrated by a brief application of heat, preferably between 130° and 200° C. for about 1 minute.

Since copper surfaces easily form oxide films, it is preferred that the copper be cleaned, the rinse water be quickly removed, e.g., with an air knife, and the surface thoroughly dried by a brief exposure to heat, e.g., between 130° and 200° C. for about one minute. To avoid build up of an oxide layer, it is preferred to coat copper surfaces within four hours after cleaning, and more preferably within two hours.

For printed wiring board or multilayer board applications, the coating may be applied to a board surface which consists of a copper conductive pattern and an organic insulating background. The coating may be applied by any convenient method such as roller coating, serigraphy, or curtain coating. For roller coating, it is preferred to use less solvent and apply the coating at a viscosity of about 50 Pa.s. For serigraphy, a viscosity of 30 to 50 Pa.s is recommended. For curtain coating, it is preferred to adjust the viscosity to 0.5 and 1 Pa.s.

Pin holes in the coating can lead to localized failure of adhesion, especially in multilayer applications. Roller coating application of the coating is preferred to substantially eliminate possible pin holes. When serigraphy (screen printing) is used to apply the coating, possible pinholes are substantially eliminated by coating the surface twice and rotating the orientation of the surface to the coating machine between coating applications.

In an alternative procedure, the coating may be applied to a release film and dried to form a dry film. The dry film is applied to a board surface by a hot roll, vacuum or press laminating technique.

The preferred thickness of the cured coating is at least 20 micrometers. More preferred is 30 micrometers. In the case of multilayer boards, the maximum thickness is set by the required dielectric properties and impedance of the finished multilayer board. It is usually preferred that the impedance value of the signal conductors be established mainly by the dielectric insulating layer applied over the poly(vinyl acetal)-phenolic primer coating layer and not by the primer.

After application, the coating is preferably cured by a gradual application of increasing temperature. The first portion of cure should take place below about 130° C. and the last portion above about 130° C., and below about 200° C.

In one curing cycle after application, the coating is dried and partially cured at a temperature sufficient to drive off most of the solvent. For solvents with boiling points about 90° to 120° C., a drying temperature of 120° C. for 15 minutes in a convection oven or tunnel is sufficient. The curing cycle is continued to completely cure the coating. The coating should be completely cured in order to obtain the maximum bond, chemical and thermal resistance. The complete curing temperatures should be over 135° C. Curing temperatures over 145° C. are preferred in order to insure the condensation of the resin system and reaction of the methylol and methyl ether groups in the phenolic resin. More preferred are cures at about 160° C. for 30 minutes to 2 hours. The curing temperature is preferably below 200° C. and more preferably below 185° C. To prevent the entrapment of the volatile products of the condensation reactions during cure, the complete cure should be accomplished before overlaying the poly(vinyl acetal)-phenolic primer coating with an additional dielectric insulating layer.

When the poly(vinyl acetal)-phenolic coating is used as a primer over the inner layer conductive pattern for multilayers, the dielectric insulating layer may be laminated over the poly(vinyl acetal)-phenolic primer by conventional press lamination, or it may be applied over the primer as a liquid coating by roller coating, serigraphy or curtain coating or the like.

EXAMPLE 1

A four layer multilayer test panel for thermal shock testing was designed which has inner layer ground and power planes which were solid sheets of copper perforated only with small insulating rings around the plates through holes. The conductive pattern for the outer layers had lands for the plated though holes and a square ground shield pattern 75 mm×75 mm. The ground shield was solid without the perforations or cross hatching sometimes used to provide stress relief. The outer layer ground shield was positioned directly over an unperforated portion of the inner layer ground or power plane.

The inner layer conductive patterns were formed on a 1.4 mm thick glass cloth reinforced epoxy laminate by conventional additive printed wiring board manufacturing techniques. The copper conductive pattern was 35 micrometers thick.

The inner layers were scrubbed with pumice, rinsed, the rinse water blown off with an air knife and then the inner layers were dried in an oven at 160° C. for one minute.

The inner layers were divided into three groups. The first group was serigraphically coated with an epoxy solder mask as a dielectric insulating layer. The second group was given a black oxide treatment, and then coated with the epoxy solder mask. The third group was coated with the phenolic-poly(vinyl butyral) primer below before application of the solder mask.

The phenolic-poly(vinyl butyral) coating for copper was prepared as follows:

| | |
|---|---|
| A solution containing: poly(vinyl butyral) 25% resole phenolic resin 50% butyl butoxyethanol 25% (commercially available as HRJ 4348 TM from Schenectady Chemicals, Inc., Schenectady, New York 12301) | 100 g |
| Wollastonite (particle size less than 10 micrometers having 1 m² surface area per gram, commercially available from NYCO, Willsboro, NY 12996) | 55 g |
| Neoalkoxy tris(3-amino)phenyl zirconate (commercially available from Kenrich Petrochemical, Inc., Bayonne, NJ 07002 as LZ 97 TM) | 1.6 g |
| Defoamer (Special combination of foam destroying substances, silicone free - believed to contain trimethyl benzene, cumene and foam destroying polymers, commercially available from BYK-Chemie USA, Wallingford, CT 06492 as Byk-A 501 TM) | 1 g |
| 2-butoxyethanol | 5 g |
| 2-(2-butoxyethoxy)ethanol | 5 g |
| Clay filler containing 1200 ppm palladium | 2 g |

This produced a viscosity of 30 to 40 Pa.s suitable for serigraphy, and the coating was applied serigraphically, dried at 120° C. for 15 minutes and then cured at 160° C. for 60 minutes to produce a coating over the inner layer 25 micrometers thick.

The epoxy solder mask applied to all three groups of panels was Solder Mask 666 commercially available from LeaRonal, Freeport, NY 11520. In order to serigraphically print a thicker coating and one catalytic for electrolessly plating through holes, the solder mask was modified as follows:

| | |
|---|---|
| Solder Mask 666 | 100 g |
| Wollastonite | 40 g |
| Neoalkoxy tris(3-amino)phenyl titanate (commercially available from Kenrich Petrochemical, Inc. as Lica 97 TM) | 2 g |
| Clay filler containing 1200 ppm palladium | 4 g |
| 2-(2-butoxyethoxy)ethanol | 5 g |

The epoxy solder mask coating was applied twice, dried at 65° C. for 15 minutes and then at 150° C. for 15 minutes, and then reapplied, redried, and total coating cured for 2 hours at 160° C. to achieve a dielectric insulating layer 80 to 100 micrometers thick.

All three groups of multilayer test panels were coated with the following additive printed wiring board adhesive. The adhesive was applied by curtain coating and dried and cured to give a thickness of 20 to 30 micrometers.

| | |
|---|---|
| Nitrile rubber (CBS Hycar 1041 TM, a product of The BF Goodrich Co., Cleveland, Ohio 44131) | 16.88 g |
| Chlorosulfonated polyethylene rubber (Hypalon 20 TM, a product of E. I. DuPont de Nemours & Co., Inc.) | 5.67 g |
| Palladium catalyst (1%) dispersed in a liquid epoxy resin with an epoxide equivalent weight of 180 | 3.32 g |
| Zirconium silicate filler (Excellopax TM, a product of TAM Ceramics, Inc. Niagara Falls, NY 14305) | 11.45 g |
| Fumed silica (Cab-O-Sil TM, a product of Cabot Corp., Tuscola, IL 61953) | 0.27 g |

-continued

| | |
|---|---|
| High Flash Aromatic Naptha with 82-88% aromatics and a boiling range of 150-200° C. | 11.48 g |
| 2-Ethoxyethyl acetate | 28.76 g |
| 2-Methylphenol-formaldehyde resin with an average degree of polymerization of eight (HJR 2527 TM, a product of Schenectady Chemicals, Inc.) | 6.97 g |
| Solid diepoxide bisphenol A resin with an epoxide equivalent weight of 500 (Epon 1001 TM, a product of Shell Chemical Co.) | 12.03 g |
| Flow promoter (Modaflow TM, from Monsanto Co. - believed to be a butyl acrylate polymer) | 0.97 g |
| Catalytic Clay filler containing 1200 ppm palladium | 1.93 g |
| Neoalkoxy tris(3-amino)phenyl zirconate (LZ 97 TM, a product of Kenrich Petrochemicals, Inc., Bayonne, NJ) | 1.40 g |

The through holes were drilled in all three groups of multilayer test panels; the resist patterns were printed on the outer layers outlining the conductive pattern; the holes were desmeared and the outer conductive patterns adhesion promoted; and then all three groups were electrolessly plated with copper to a thickness of 35 micrometers. The three groups of panels were then rinsed, dried and post cured for 2 hours at 160° C.

The three groups of now finished multilayer test panels were thermally shocked in a hot air solder leveling machine to test the adhesion of the dielectric insulating layer to the inner layer copper conductive pattern. The hot air solder leveling cycle is (1) cleaning, (2) flux application, (3) immersion in molten solder at 255° C. for 2 seconds, (4) blow off excess solder with hot air at 210° C., (5) cool and wash to remove flux residues. Each group of multilayer panels was subjected to five cycles of hot air leveling.

The first group of panels in which the dielectric insulating layer was applied directly to clean copper, failed in the first cycle by separation of the dielectric layer from the inner ground plane in the area underneath the 75 mm × 75 mm outer layer ground shield.

The second group of panels had the dielectric insulating layer applied to an adherent black oxide coating on the inner ground plane. In this group, failure occurred on all panels due to pink ring around the holes. By the end of the five hot air leveling cycles, this caused blisters to form between the dielectric insulating layer and the inner layer.

In the third group of panels which, according to this invention, had a phenolic-poly(vinyl acetal) coating on the inner layer copper conductive pattern, all panels passed five cycles of hot air leveling without any blistering or
5 delamination even in the areas between the 75 mm × 75 mm outer layer ground shield and the inner ground planes.

EXAMPLE 2

A poly(vinyl acetal)-phenolic coating was prepared and tested as in example 1 except that a phenolic resin-poly(vinyl butyral) blend known as HRJ 4325 TM (commercially available from Schenectady Chemicals, Inc.) was substituted for HRJ 4348, and neoalkoxy tris(3-amino)phenyl titanate (commercially available as Lica 97 TM from Kenrich Petrochemicals, Inc.) was substituted for the neoalkoxy tris(3-amino) zirconate.

HRJ 4325 contains:

| | |
|---|---|
| Phenolic resole resin | 40% |
| Polyvinyl butyral | 50% |
| Solvent | 10% |

In this example, the dielectric insulating layer was 110 to 130 micrometers thick. Equivalent results were obtained. The multilayer panels with the poly(vinyl acetal)-phenolic coating on the inner copper layers did not fail during the five hot air solder leveling cycles.

However, when this example was repeated with dielectric insulating layers only 50 to 75 micrometers thick, some failures were observed.

EXAMPLE 3

A fully-additive multilayer was prepared using the phenolic-poly(vinyl butyral) coating of this invention. The procedure of Example 1 was repeated with the following exceptions. The phenolic-poly(vinyl butyral) coating was dried at 120° C. for 20 minutes, and was not fully cured before applying the solder mask. Each layer of the solder mask was dried at 120° C. for 20 minutes. After all the solder mask was applied, the coating and solder mask were partially cured at 160° C. for 20 minutes. After the adhesive was applied and dried, the coating, solder mask and adhesive were all completely cured at 160° C. for one hour.

Although the examples above describe the application of the coatings of this invention in the manufacture of additive printed circuit multilayer boards, those skilled in the art will appreciate that the chemical resistance and the thermal shock resistance of the bonds created by these coatings and taught by this invention can be applied to manufacture of both conventional and semi-additive multilayer boards.

In the manufacture of multilayer boards by the conventional subtractive process or the semi-additive process, the poly(vinyl acetal)-phenolic resin coatings of this invention can be applied to the etched inner layers before lamination instead of the black, brown or red oxide.

The chemical and thermal resistance achieved by this invention also may be employed outside the field of printed wiring board manufacture. Those skilled in the art will appreciate that the coatings of this invention can be utilized in bonding copper to plastics, and metals to metal or to plastics and other surfaces. It is especially useful for bonding copper to metals, plastics and other surfaces.

I claim:

1. A coating composition capable of adhering to a metal surface and maintaining the adhesion, essentially without outgassing for at least 10 seconds when heated at 250° C., and capable of being adhesion promoted by a chromic acid adhesion promotion solution, the coating composition comprising:

the product of reacting between 20 to 60% by weight of a poly(vinyl acetal) resin with 80-40% by weight phenolic resin in the presence of an acidic catalyst, said phenolic resin being a polymer formed by the condensation reaction of an aldehyde and a phenol, the phenol being selected from the group consisting of unsubstituted phenol, substituted phenols, cresole, xylenols and resorcinol;

a coupling agent having at least two amino substituted aromatic groups covalently bonded to a titanium or zirconium central atom via an oxygen containing linkage, said coupling agent being capable of coupling to a metal surface and capable of reacting with the phenolic resin, said coupling agent being present in the composition in an amount sufficient to couple the poly(vinyl acetal)-phenolic resin reaction product to the metal surface; and sufficient organic solvent to dissolve the resins and coupling agent and establish a viscosity for the coating composition suitable for applying the coating composition to a substrate.

2. The coating composition of claim 1 wherein the amount of coupling agent is between 0.3 to 2% by weight of the total resin content of the coating composition.

3. The coating composition of claim 1 further comprising a mineral filler in an amount sufficient to substantially eliminate smear of the coating composition on walls of holes when the coating composition is applied onto a metal surface, cured, and holes are drilled through the coating composition, and less than an amount that will cause torsion fracture of the interface between the coating composition and a metal surface, when the coating composition is applied and cured on the metal surface, said coupling agent also being present in an amount sufficient to wet out and couple the filler to the poly(vinyl acetal)-phenolic reaction product.

4. The coating composition of claim 3 wherein the viscosity for applying coating composition is greater than 20 Pa.s and the mineral filler is present in an amount sufficient to effect the release of air bubbles entrapped during application of the coating composition to a substrate.

5. The coating composition of claim 4 wherein the filler is present in an amount of at least 20 parts and less than 60 parts filler per hundred parts of the poly(vinyl acetal)-phenolic reaction product.

6. The coating composition of claim 5 wherein the filler is present in an amount of at least 30 parts and less than 50 parts filler per hundred parts of the poly(vinyl acetal)-phenolic reaction product.

7. The composition of claim 3 wherein the filler is selected from wollastonites, aluminas, talcs, silicates, and clays and combinations thereof.

8. The composition of claim 7 wherein the filler is selected from the group consisting of wollastonites and attapulgites and combinations thereof, and the coupling agent is selected from the group consisting of neoalkoxy tris(3-amino) phenyl zirconates and titanates.

9. A coating composition comprising the product of reacting between 20 to 60% by weight of a poly(vinyl acetal) resin with 80-40% by weight phenolic resin in the presence of an acidic catalyst, said phenolic resin being a polymer formed by the condensation reaction of an aldehyde and a phenol, the phenol being selected from the group consisting of unsubstituted phenol, substituted phenols, cresole, xylenols and resorcinol; a coupling agent having at least two amino substituted aromatic groups convalently bonded to a titanium or zirconium central atom via an oxygen containing linkage, said coupling agent being capable of coupling to a metal surface and bonding to the phenolic resin, said coupling agent being present in the composition in an amount sufficient to couple the poly(vinyl acetal)-phenolic resin reaction product to the metal surface; and an organic solvent.

10. The composition of claim 9 wherein the coupling agents are selected from the group consisting of amine terminated aromatic zirconates and titanates.

11. The composition of claim 10 wherein the coupling agents are selected from the group consisting of neoalkoxy tris(3-amino)phenyl zirconates and titanates.

* * * * *